US005897754A

United States Patent [19]

Fujii et al.

[11] Patent Number: 5,897,754

[45] Date of Patent: Apr. 27, 1999

[54] METHOD FOR MANUFACTURING A HOLLOW TUBE BODY

[75] Inventors: Kenichi Fujii, Kobe; Mamoru Takeda, Hirakata, both of Japan

[73] Assignee: Matsushita Electric Industrial Co., Ltd., Osaka, Japan

[21] Appl. No.: 08/969,095

[22] Filed: Nov. 13, 1997

Related U.S. Application Data

[62] Division of application No. 08/535,650, Sep. 28, 1995, Pat. No. 5,742,126.

[30] Foreign Application Priority Data

Sep. 28, 1994 [JP] Japan .................................... 6-233835
Apr. 5, 1995 [JP] Japan .................................... 7-080084

[51] Int. Cl.[6] .................................................. C23C 14/34

[52] U.S. Cl. .................................................. 204/192.12

[58] Field of Search ......................... 204/192.12, 192.26, 204/298.21

[56] References Cited

U.S. PATENT DOCUMENTS

| | | | |
|---|---|---|---|
| 1,917,271 | 7/1933 | Potter | 204/198.12 |
| 4,339,686 | 7/1982 | Potter . | |
| 4,393,100 | 7/1983 | Potter . | |
| 4,960,753 | 10/1990 | Collins et al. | 204/298.21 |
| 5,270,615 | 12/1993 | Chang . | |

FOREIGN PATENT DOCUMENTS

| | | |
|---|---|---|
| 0 283 923 | 9/1988 | European Pat. Off. . |
| 04337241 | 11/1992 | European Pat. Off. . |
| 06111792 | 4/1994 | European Pat. Off. . |
| 07082526 | 3/1995 | European Pat. Off. . |
| 4-370644 | 12/1992 | Japan . |
| 5-87938 | 12/1993 | Japan . |
| 2 108 945 | 5/1983 | United Kingdom . |
| 7069678 | 3/1995 | WIPO . |

OTHER PUBLICATIONS

K. Gemma et al., "Effect of NH3–O2 Gas Mixtures on the Protective Oxide Film on High Chromium Alloy Steels," Mat.–wiss. u. Werkstofftech, 24, 378–385 (1993).

EP Search Report dated Apr. 16, 1998 corresponding to Application No. EP 95 11 4825.

*Primary Examiner*—Kenneth J. Ramsey
*Attorney, Agent, or Firm*—Ratner & Prestia

[57] ABSTRACT

In a quartz glass tube body for high-pressure discharge lamp, the devitrification occurs during lighting, a light flux decreases and finally the useful life ends, where the main cause of this devitrification phenomenon is reaction between a sealed substance and the quartz glass tube body. It is one object of the present invention to attain the longer useful life, for example, of a high-pressure discharge lamp by preventing such a phenomenon. According to the present invention, a coating is made up by forming one or more oxynitride layers of an element chosen from among aluminum, tantalum, niobium, vanadium, chromium, titanium, zirconium, hafnium, yttrium, scandium, magnesium, silicon and lanthanum rare earth elements. By incorporating a bilayer coating on the inside wall of said hollow tube body, for example, that is composed of an aluminum oxynitride layer and an aluminum nitride layer obtained from application of a high-frequency wave between the sputter electrodes and generation of a glow discharge, a durable coating can be formed, thereby enabling the useful life of a high-pressure discharge lamp to be lengthened.

6 Claims, 8 Drawing Sheets

METHOD FOR MANUFACTURING A HOLLOW TUBE BODY

This application is a division of application Ser. No. 08/535,650, filed Sep. 28, 1995, now U.S. Pat. No. 5,742,126.

BACKGROUND OF THE INVENTION

1. Field of the Invention

The present invention refers to a high-pressure discharge lamp to be utilized e.g., for general illumination or for projection display, a method for manufacturing a discharge lamp body for high-pressure discharge lamps, and a method for manufacturing a hollow tube body.

2. Description of the Prior Art

Thus far, for metal halide discharge lamps, quartz glass components (comprising nearly 100% $SiO_2$) has often been used.

However, defects in quartz glass material are mentioned in that quartz glass becomes likely to react with the high-pressure gas enclosed in a lamp when the duration of lamp lighting increases, thereby inevitably decreasing the optical transmissivity, that a marked low thermal conductivity. (approx. 0.9 W/mK) hinders the distribution of heat from becoming uniform, and the like.

Furthermore, there has occurred also a problem that the internal heat convection stimulated by the above nonuniform temperature distribution results in a large curvature of discharge arc.

Thus, a countermeasure is also considered that a protective layer comprising a monolayer or multi-layers aluminum oxide coating, tantalum oxide coating or others is provided on the interior of a quartz glass discharge tube body (e.g., U.S. Pat. No. 5,270,615 Specification).

However, as a defect due to such a countermeasure in conventional discharge tube bodies, it is mentioned that the corrosion resistance of an oxide coating at high temperature is not high enough for practical use.

That is, since reaction of rare earth metal halide enclosed in a lamp with the oxide coating is perceived in a state of high temperature near to 1000° C. during lamp lighting, it can be said in the conventional countermeasure mentioned above that the preventive effect on devitrification remains still insufficient.

Also, because an oxide coating was used as a protective coating, there was an insufficient point that no effect of thermally uniformizing a discharge tube body cannot be. obtained.

On the other hand, as another countermeasure, there has been made an attempt to obtain effects of preventing the devitrification due to a high corrosion resistance, uniformizing the temperature distribution in a discharge tube body due to a high thermal conductivity and further improving the heat load characteristic by using a ceramic ($Al_2O_3$, AlN, YAG, spinels or the like) discharge tube body (e.g., Japanese Patent Publication No. 87938/1993).

However, the ceramic discharge tube body mentioned above has defects in that corrosion in the sealing portion between a ceramic tube body and the end face cannot be ignored, that its characteristic deviates from that of an ideal point light source as a result of a fall in straight light transmissivity due to intergranular reflection in a ceramic sinter and the like, so that it is kept from being put into practical use.

Also, the ceramic discharge tube body mentioned above generally arouses a discontent that the cost is high and a complicated manufacturing process is needed in comparison with a quartz glass tube body.

For solving the above conventional problems, the present invention has an object in achieving a high-pressure discharge lamp capable of preventing the devitrification more efficiently and having a longer useful life than former by using an oxynitride coating indicative of higher durability than that of a conventional oxide coating as the inside wall of a discharge tube body.

Meanwhile, the linear expansion coefficient of quartz glass is characteristically small (0.54 ppm/° C.). Even if aluminum oxide (7–8 ppm/° C.) or other metal oxides having a large linear expansion coefficient is formed directly on quartz glass as a corrosion-resistant coating, the inside wall coating comes to crack or peel off under action of dynamic mechanical stress generated when a high temperature (approx. 1000° C. at the maximum) during operation of a lamp and a room temperature during extinction are repeated and consequently a substantially durable structure has not yet implemented at present from the practical standpoint.

The aforesaid U.S. Pat. No. 5,270,615 intends to solve the above problems by using an oxide coating having a thermal expansion coefficient ranging from 1 to 4 ppm/° C. as the under coating, but this is also still insufficient. Thus, it is another object of the present invention to provide a novel coating structure having a greater durability in practical use with account paid to a substantial linear expansion coefficient in each constituent layer of the protective layer.

SUMMARY OF THE INVENTION

A high-pressure discharge lamp of the present invention comprises a coating comprising at least one oxynitride layer of one or more elements disposed on the inside wall of a quartz glass hollow tube body in which an inert gas and either one or more metals or one or more metal halides are sealed.

It is preferable that:

the one or more elements are selected from among aluminum, tantalum, niobium, vanadium, chromium, titanium, zirconium, hafnium, yttrium, scandium, magnesium, silicon and lanthanum rare earth elements.

It is preferable that:

the coating includes at least aluminum oxynitride layer.

It is preferable that:

the aluminum oxynitride layer contains Si, Mg or Y.

It is preferable that:

when the coating comprises a plurality of layers, these layers include at least a nitride layer and an oxynitride layer formed by using the same element as that used for forming the nitride.

It is preferable that:

the hollow tube body is a discharge tube body and electrodes protruding toward the interior of the discharge tube body are provided.

It is preferable that:

the hollow tube body is a discharge tube body, no electrode is provided inside the discharge lamp and excitation emission of light is arranged to occur under action of microwave or high-frequency wave given from the outside of the discharge tube body.

It is preferable that:

the quartz glass is in an exposed state on the inside wall at the end of the hollow tube body.

A method for manufacturing a hollow tube body of the present invention comprises the steps of:

inserting, from an opening provided at each of both ends of a predetermined hollow tube body, a pair of sputter electrodes containing the same element as that of a coating to be formed on the inside wall of the hollow tube body;

fixing the pair of sputter electrodes in such a manner that the distance between the tips of the pair of mutually opposed sputter electrodes is kept apart by a predetermined distance; and forming the coating on the whole or a part of the inside wall of the hollow tube body in the sputtering process by applying DC voltage or high-frequency voltage between the the fixed sputter electrodes and generating a glow discharge.

A method for manufacturing a hollow tube body of the present invention comprises the steps of:

inserting, from an opening provided at each of both ends of a predetermined hollow tube body, a pair of sputter electrodes provided at their tips with targets containing the same element as that of a coating to be formed on the inside wall of the hollow tube body;

fixing the pair of sputter electrodes in such a manner that the distance between the tips of the pair of mutually opposed sputter electrodes is kept apart by a predetermined distance; and forming the coating on the whole or a part of the inside wall of the hollow tube body in the sputtering process by applying DC voltage or high-frequency voltage between the the fixed sputter electrodes and generating a glow discharge.

It is preferable that:

the part of the inside wall of the hollow tube body means the whole or a part of portions of the inside wall other than those near to the openings.

It is preferable that:

the tips of the sputter electrodes are put into a nonplanar shape.

It is preferable that:

the tips of the targets are put into a nonplanar shape.

A method for manufacturing a discharge tube body for high-pressure discharge lamps of the present invention, wherein a predetermined coating is formed on the inside wall of a quartz glass hollow tube body, comprises the steps of:

forming a nitride layer of one or more elements on the inside wall of the hollow tube body; and thereafter applying the oxidation treatment to the formed nitride layer, thereby changing the whole or a part of the nitride layer into an oxynitride layer.

A method for manufacturing a discharge tube body for high-pressure discharge lamps of the present invention, wherein a predetermined coating is formed on the inside wall of a quartz glass hollow tube body, comprises the steps of:

forming an oxide layer of one or more elements on the inside wall of the hollow tube body; and thereafter applying the nitriding treatment to the formed oxide layer, thereby changing the whole or a part of the oxide layer into an oxynitride layer.

A method for manufacturing a high-pressure discharge lamp of the present invention, wherein a predetermined coating is formed on the inside wall of a quartz glass hollow tube body, comprises the steps of:

forming a layer of a predetermined metal layer on the inside wall of the hollow tube body; and thereafter applying the oxynitriding treatment to the formed metal layer, thereby changing the whole or a part of the metal layer into an oxynitride layer.

A high-pressure discharge lamp of the present invention comprises a coating, comprising at least:

a first layer of transparent dielectric having a linear expansion coefficient substantially ranging from 0.8 to 2 ppm/° C. formed on the inside wall of a quartz glass hollow tube body in which an inert gas and either one or more metals or one or more metal halides are sealed;

a second layer of transparent dielectric having a linear expansion coefficient substantially ranging from 2 to 5 ppm/° C. formed on the first layer; and a third layer of transparent dielectric having a linear expansion coefficient substantially ranging from 5 to 10 ppm/° C. formed on the second layer.

It is preferable that the top layer of the coating is an oxynitride layer.

According to the invention of the present application, since a structure with a more highly corrosion-resistant oxynitride than former provided on the inside surface of a discharge tube body is achieved under operating environment of a high-pressure discharge lamp, preventing the devitrification is more possible than former and providing a longer useful life of high-pressure discharge lamp becomes possible.

In addition, a manufacturing method according to the invention of the present application, for example, strengthens the uniformization and adhesive force of a sputtering coating, so that peeling off of the coating becomes less likely to occur than former.

DETAILED DESCRIPTION OF THE PREFERRED EMBODIMENTS

Hereinafter, a high-pressure discharge lamp according to the present invention, a method for manufacturing a discharge lamp body for the high-pressure discharge lamp, and a method for manufacturing a hollow tube body will be described.

Figure 1:
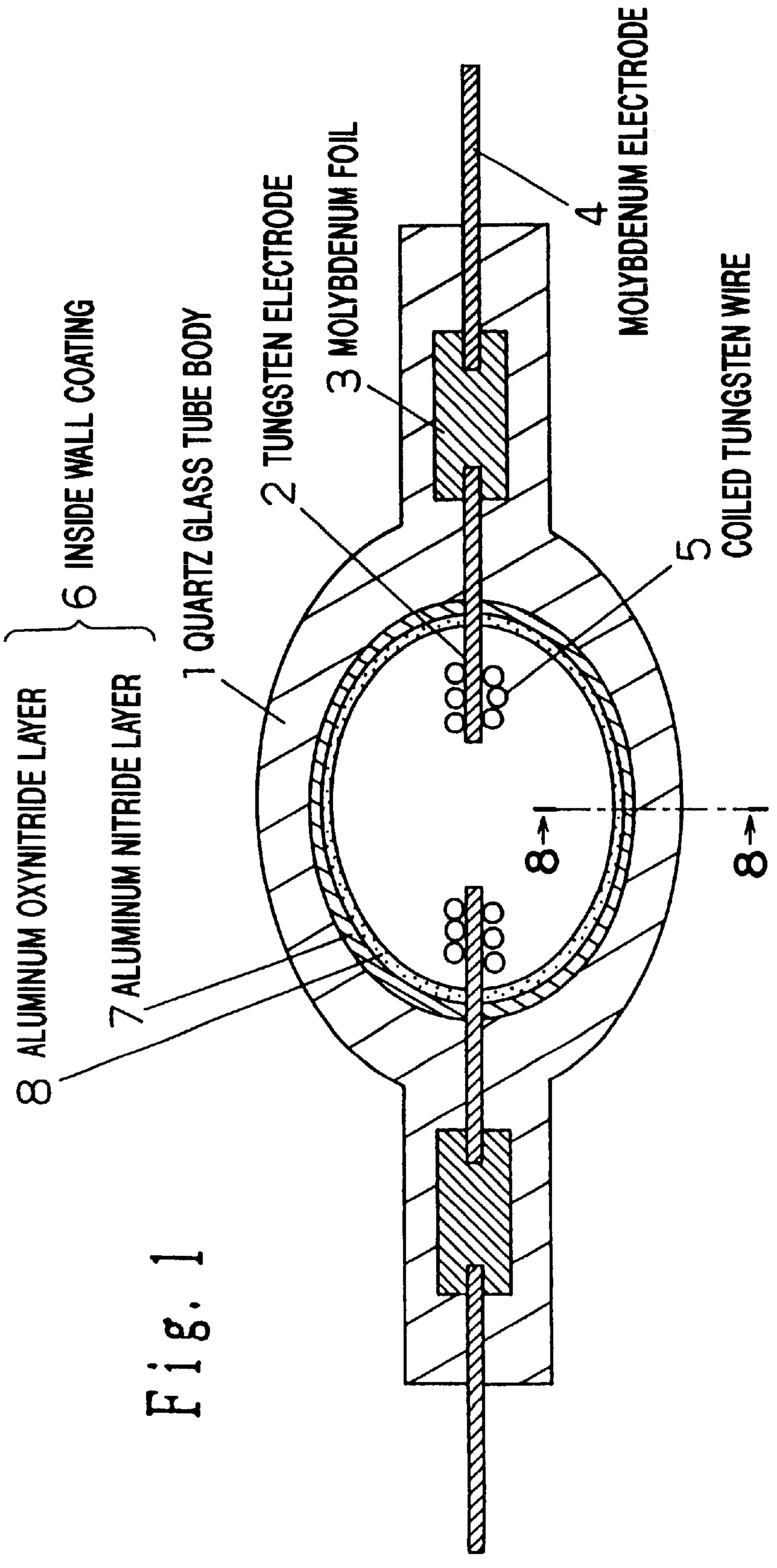
FIG. 1. is a sectional schema of a high-pressure discharge lamp according to one embodiment of the present invention.

FIG. 1 is a sectional schema of a high-pressure discharge lamp according to one embodiment of the present invention and the constitution of the present embodiment will be described by referring to FIG. 1.

Incidentally, a plurality of stacked layers formed on the surface of the inside wall of a hollow tube body shall be collectively called a coating. That is, a coating called here comprises a plurality of layers in ordinary cases. Accordingly, there are cases where it is called a multi-layer coating instead of being simply called a coating. However, when there is only one layer formed, the above coating means the only one layer itself. Thus, from a concept of contrast to the above multi-layer coating, it is also called a monolayer coating.

On the other hand, the numbering of each layer constituting a coating, for example, is carried out in such a manner as to set the layer formed on the surface of the inside wall of a quartz glass tube body 1 for a high-pressure discharge lamp to a first layer and set the layer formed on the surface of the first layer to a second layer. That is, the numbering of each layer is performed in increasing order according as each layer becomes distant from the inside wall of a hollow tube body.

In FIG. 1, Numeral 1 denotes a quartz glass tube body, inside which tungsten electrodes 2, each having a coiled tungsten wire 5 provided near the tip, are oppositely disposed.

Numerals 3, 4 and 6 denote a molybdenum foil, molybdenum electrodes and the inside wall coating formed on the quartz glass tube body 1, respectively. This inside wall coating 6 comprises two layers of an aluminum nitride layer 7 and an aluminum oxynitride layer 8 as will be described below.

Figure 2:
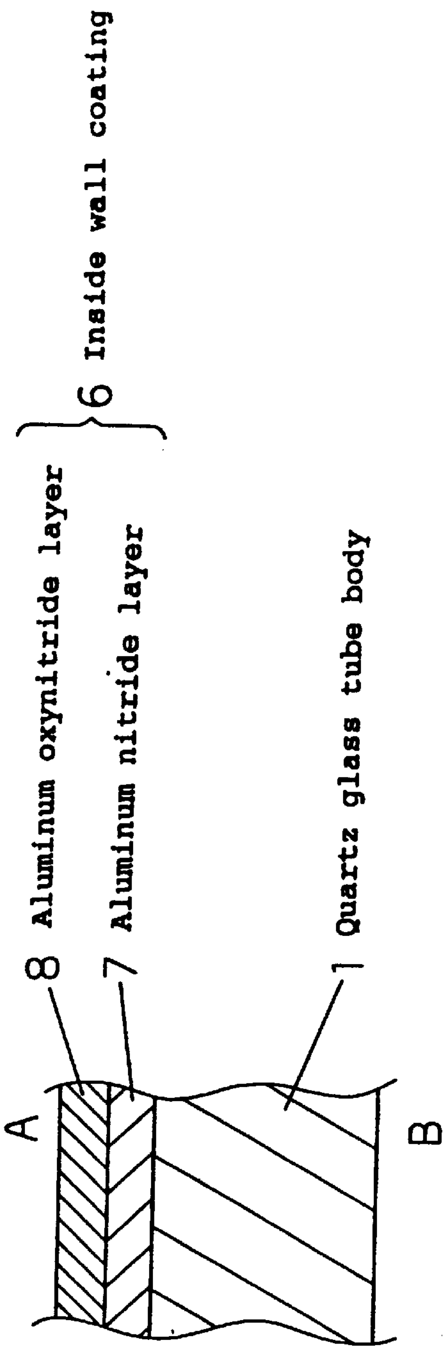
FIG. 2 is an arrow-viewed partly enlarged sectional schema taken along the line A–B of FIG. 1.

That is, FIG. 2 is an arrow-viewed enlarged sectional schema schematically showing an arrow-viewed section of the portion designated with the line A–B of FIG. 1. In this embodiment on the quartz glass tube body 1, an aluminum nitride layer 7 is formed to a thickness of 600 angstrom (hereinafter abbreviated to A), on which an aluminum oxynitride layer 8 is formed to a thickness of 1200 Å.

Figure 3:
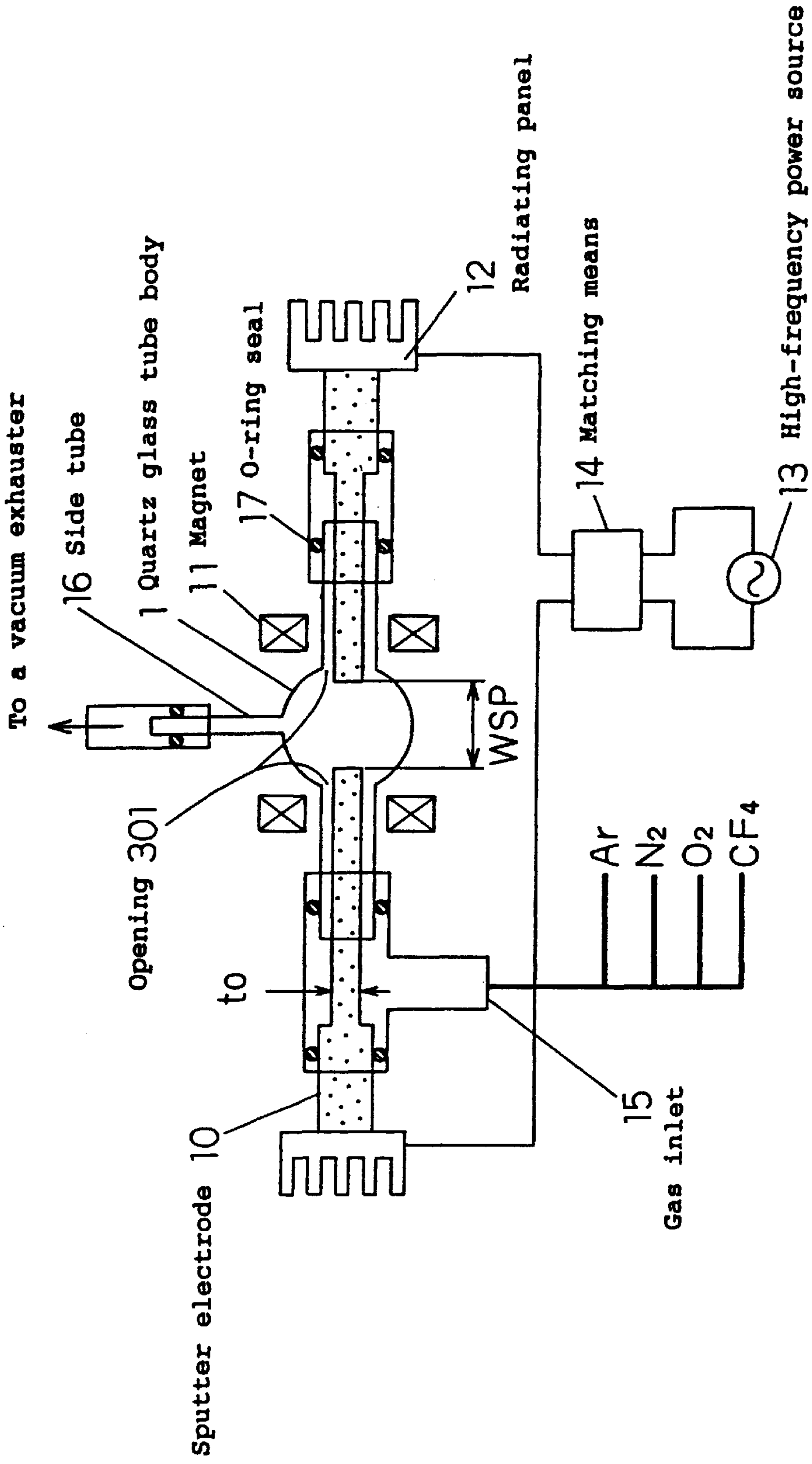
FIG. 3 is a schema of a sputtering device used in a method for manufacturing a discharge tube body for high-pressure discharge lamps according to one embodiment of the present invention.

Next, referring to FIG. 3, a method for manufacturing a discharge tube body for high-pressure discharge lamps according to one embodiment of the present invention will be described around its constitution. FIG. 3 is a schema of a sputtering device used in a method for manufacturing a discharge tube body for high-pressure discharge lamps according to one embodiment of the present invention.

As shown in FIG. 2, the formation of a coating comprising two layers of an aluminum nitride layer 7 and an aluminum oxynitride layer 8 (hereinafter referred to also as bilayer coating) is accomplished at a manufacturing step prior to enclosing the tungsten electrodes 2 into the quartz glass tube body 1.

Accordingly, at the coating formation of this bilayer coating, a side tube 16 used for enclosing metal and metal halide still remains. This is because the side tube 16 is necessary in a later manufacturing step.

On the other hand, the present embodiment differs from a conventional constitution in that the sputter electrodes 10 are constructed by using a material containing the same element as that of a coating to be formed on the inside wall of the quartz glass tube body 1. That is, the sputter electrode 10 are provided with both functions of a sputter electrode and a target electrode that have so far been provided separately.

The metal element in either of the aluminum nitride layer 7 and the aluminum oxynitride layer 8 is aluminum in common with each other. Thus, the sputter electrodes 10 used metal aluminum (99.999% pure) in common both for forming an aluminum nitride layer 7 and for forming an aluminum oxynitride layer 8.

The sputter electrodes 10 were inserted from the openings 301 at both ends of a quartz glass tube body 1 and a vacuum seal was implemented by using O-ring seals 17.

In this way, a pair of sputter electrodes 10 inserted to oppose one tip to the other tip were fixed in such a manner that the distance Wsp between the sputter electrodes may be approx. 12 mm. Incidentally, the diameter of the sputter electrodes to is set to 4.4 mm.

Connected to this pair of sputter electrodes 10 through matching means 14 is a high-frequency power source 13.

Numeral 12 denotes a radiating panel composed of aluminum blocks, effective in preventing a rise in target temperature during sputtering. In the case of the present embodiment, since sputter electrodes 10 serves also as a sputter target as mentioned above, the radiating plate 12 is effective in preventing a rise in the temperature of the sputter electrodes 10.

To the gas inlet 15, a piping is connected so that inert gas, Ar, reactive gas, $O_2$ or $N_2$, and inside-wall plasma cleaning gas, $CF_4$, can be supplied.

Magnets 11, disposed to make the electric field and the magnetic field in parallel, contribute to raising the sputtering speed but are not always required.

The side tube 16 is connected to an exhaust system with a turbo-molecular pump provided as the main exhaust pump. As high-frequency power source 13, a certain model having a frequency of 500 kHz and a maximum power of 250 W was used.

While further describing a high-pressure discharge lamp with a bilayer coating comprising an aluminum nitride layer and an aluminum oxynitride layer in details, one embodiment of the manufacturing method thereof will be described in further detail.

As shown in FIG. 3, insert metal aluminum (99.999% pure) sputter electrodes 10 from the openings 301 at both ends of a discharge tube body of a quartz glass and evacuate to a high vacuum of $5\times10^{-4}$ Pa.

Then, pass 3.1 sccm Ar gas, pass 1.4 sccm Nitrogen gas and apply 20 W high-frequency wave by using a high-frequency power source 13.

Then, pass 3.1 sccm Ar gas, pass 0.9 sccm Nitrogen gas, pass 0.5 sccm Oxygen gas and apply 20 W high-frequency wave.

The sputter discharge time was set in such a manner that a 600 Å thick aluminum nitride layer 7 and a 1200 Å thick aluminum oxynitride layer 8 were formed.

Then, install a tungsten electrode 2 (see FIG. 1) to a quartz glass discharge tube body 1 at an interelectrode distance of 5.5 mm, seal in mercury, dysprosium iodide, neodymium iodide, cesium iodide and Ar gas, and thus complete a high-pressure discharge lamp.

Here, the time elapsed until the screen illuminance of a high-pressure discharge lamp decreases to ½ of the initial value, is defined as the useful life of this high-pressure discharge lamp. In this case, it was confirmed that the useful life of a high-pressure discharge lamp constructed in this way lengthens by 30% and more in comparison with that of a high-pressure discharge lamp without the inside wall coating.

The test result on a monolayer inside wall coating comprising only aluminum oxide and a bilayer (multi-layer) inside wall coating comprising a first layer of aluminum nitride and a second layer of aluminum oxide is as follows: the both coatings show that the useful life lengthens only by 30% or less in comparison with that of a high-pressure discharge lamp without the inside wall coating, still less shortens in some cases. Such a result reveals that the oxynitride layers exercises an extremely effective effect on lengthening the useful life.

Then, after lighting a high-pressure discharge lamp for 1000 hr, the linear transmissivity of its tube wall was measured.

According to the results obtained from an average of 10 point measurement in the circumferential direction of a tube wall, the linear transmissivity was 53% for a monolayer oxide coating, 49% for a monolayer nitride coating and 77% for a monolayer oxynitride coating.

In this case, He-Ne laser (wavelength: 6328 Å) was used as a measuring light source.

As these, an oxynitride layer (coating) stably exhibits a much longer useful life than that of an oxide layer (coating) or a nitride layer (coating).

In addition, due to a high thermal conductivity characteristic of the aluminum nitride layer (coating), the temperature distribution of a quartz glass tube body 1 became still more uniform and consequently the arc bending during horizontal lamp lighting decreased. In the present embodiment, temperature of the tube wall of a quartz glass tube body 1 during horizontal lamp lighting is 811° C. at the top center and 809° C. at the bottom center, which exhibit a hardly observable difference in temperature.

On the other hand, in a case where no coating is formed on the inside wall of a quartz glass tube body, temperature is 818° C. at the top center and 786° C. at the bottom center, which exhibits as large difference in temperature as 32° C. Incidentally, the lamp output is 250 W, either. It is found also from this that the oxynitride layer exercises an excellent effect in implementing the uniformization of the inside wall temperature of a hollow tube body.

Incidentally, though a high purity (99.999% pure) of metal aluminum was used as sputter electrodes 10 in the above embodiment, aluminum alloys with Si, Y, Mg or the like added in aluminum may be used as sputter electrodes.

As another embodiment, by using sputter electrodes formed of aluminum alloy containing 2 wt % Si, a high-pressure discharge lamp having the inside wall of a quartz glass tube body coated with an oxynitride layer was manufactured. In this construction, the useful life lengthened by 5% in comparison with a case of using the aforesaid high-purity aluminum metal sputter electrode 10.

Substances to be sealed into a high-pressure discharge lamp may include various rare earth iodides or other metal iodides. In addition, the present invention is found applicable also to a high-pressure sodium discharge lamp.

In the meantime, as causes of effectiveness in the present invention, adopting a highly corrosion-resistant aluminum oxynitride layer as the top layer of a coating formed on the inside wall of a tube body, adopting an aluminum nitride layer as a first layer of underlying coat for contributing to an improvement in the coating quality of the top aluminum oxynitride layer and the like can be mentioned.

If a coating is constructed as mentioned above, an extremely great advantage is attained that there is no need of exchanging sputter electrodes serving also as sputter target for formation of each layer and the above bilayer coating can be obtained only by switching the setting of a gas to be introduced into a quartz glass tube body 1 from the gas inlet 15 (see FIG. 3).

An aluminum oxynitride layer is employed as the top layer in the above embodiment, a great variety of oxynitrides of other metals than aluminum can be considered in practice.

For example, by using oxynitride layer of an element chosen from tantalum, niobium, vanadium, chromium, titanium, zirconium, hafnium, yttrium, scandium, magnesium, silicon and lanthanum rare earth elements, a monolayer or multi-layer coating may be constructed and it goes without saying that this coating may contain other layers than oxynitride layer.

Compositionally, the coating may be a monolayer, bilayer, trilayer and multi-layer coating comprising four or more layers, or may be what is called a compositionally gradient material coating in which the composition gradually varies from the under coat layer to the top layer.

Incidentally, in a case of monolayer coating, needless to say, it is to construct a thin coating directly on the inside wall of a quartz glass tube body 1 by using oxynitride such as aluminum oxynitride layer 8.

Furthermore, the thickness of each layer is not limited to that shown in the above embodiment but that of an aluminum oxynitride layer, for example, may be selected among the range from 200 to 5000 Å.

The present invention takes advantage of the superiority of an oxynitride layer to oxide and nitride layers as the inside wall coating.

The nitride layer of the elements mentioned above has a higher melting point than the oxide layer thereof (for example, the melting point of aluminum nitride is 2800° C., whereas that of aluminum oxide is 2054° C.), and therefore is preferable from the standpoint of use under high temperature environment.

Furthermore, the thermal expansion coefficient is lower in a nitride layer (for example, in contrast to 4.5 ppm/° C. for aluminum nitride, 7–8 ppm/° C. for aluminum oxide) and therefore a nitride layer is advantageous to making a coat on a quartz glass tube body of low heat expansion (0.54 ppm/° C.) over an oxide layer.

On the other hand, as defects in a nitride layer, there are deficiency in oxidation resistance and a high vapor pressure due to sublimation. By making an oxynitride layer, a layer of excellent high temperature corrosion-resistant material in possession of advantages in both layers can be implemented.

Incidentally, in the above embodiment, a coating was made in a reactive sputter process by using metal sputter electrodes 10, but it is clear that a similar advantage can be obtained also in a sputter process using sputter electrodes containing oxynitride, oxide or nitride.

Furthermore, an oxynitride layer may be made in the thermo-CVD process, the plasma CVD process, the vacuum deposition process, the ion plating process or the like aside from the sputtering process mentioned above.

Also, an oxynitride layer may be formed by making a nitride layer at first, then applying such an oxidation treatment as heat oxidation or plasma oxidation to the nitride layer, or conversely, by first making an oxide layer, then applying such a nitriding treatment as heat nitriding or plasma nitriding.

Figure 4:
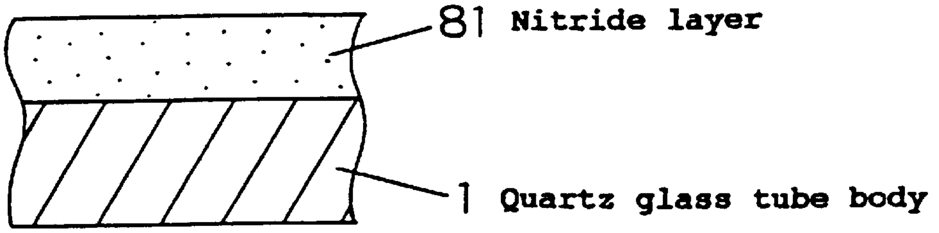
FIG. 4(A) is a schema showing a process of forming a nitride layer 81 on the inside wall of a quartz glass tube body 1.
FIG. 4(B) is a schema showing a process of applying an oxidation treatment to the nitride layer 81 formed in the process shown in FIG. 4(A)
FIG. 4(C) is a schema showing a process of changing the surface portion of the nitride layer 81 into an oxynitride layer 82.
Figure 4:
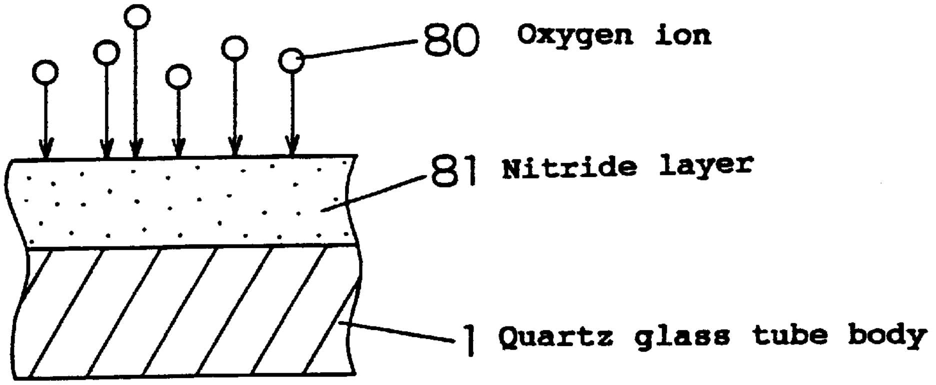
Figure 4:
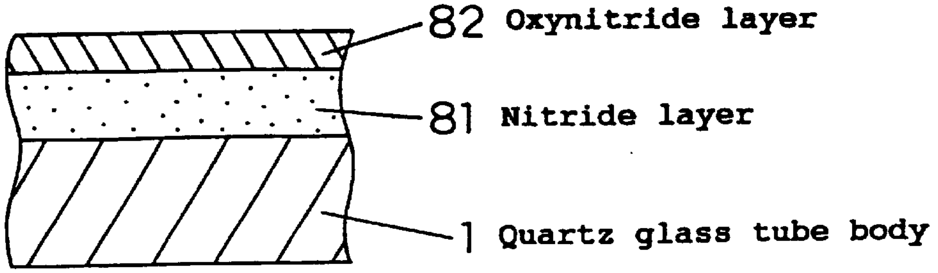

The content shown in FIGS. 4(A) to 4(C) corresponds to one example of a process of forming an oxynitride layer by making a nitride layer, then applying oxidation treatment. That is, the above figures illustrate one example of applying the above oxidation treatment to a nitride layer 81 made at first (see FIGS. 4(A) and 4(B)) and changing a surface portion of the nitride layer 81 into an oxynitride layer 82 (see FIG. 4(C)). Incidentally, another example of changing the whole nitride layer 81 made at first into an oxynitride layer 82 is of course allowable. Numeral 80 in FIG. 4(B) schematically represents oxygen ions utilized in the oxidation treatment.

Furthermore, after formation of a metal layer, it is allowable to obtain an oxynitride layer in the heat treatment or plasma treatment.

When executing a sputtering with the device shown in FIG. 3, a sputter coating grows only on the region of the inside wall facing to a space between a pair of sputter electrodes 10 in the inside wall of a quartz glass tube body 1. And, it could be confirmed from experiments that a coating hardly grows on a portion corresponding to the root of each tungsten electrode 2 (see FIG. 1) to be inserted in a later process, i.e., the inside wall near the opening 301.

By adjusting the distance between the tips of sputter electrodes 10 in a positive use of such a phenomenon, it is possible to put the quartz glass to a bare, i.e., exposed state at the root 51 of each tungsten electrode 2. The structural drawing of FIG. 5 shows an aspect of depositing a protective coating onto the entire surface of the inside wall, the root 51 of each tungsten electrode 2 differs in structure from that shown in the lamp schema of FIG. 1.

Figure 5:
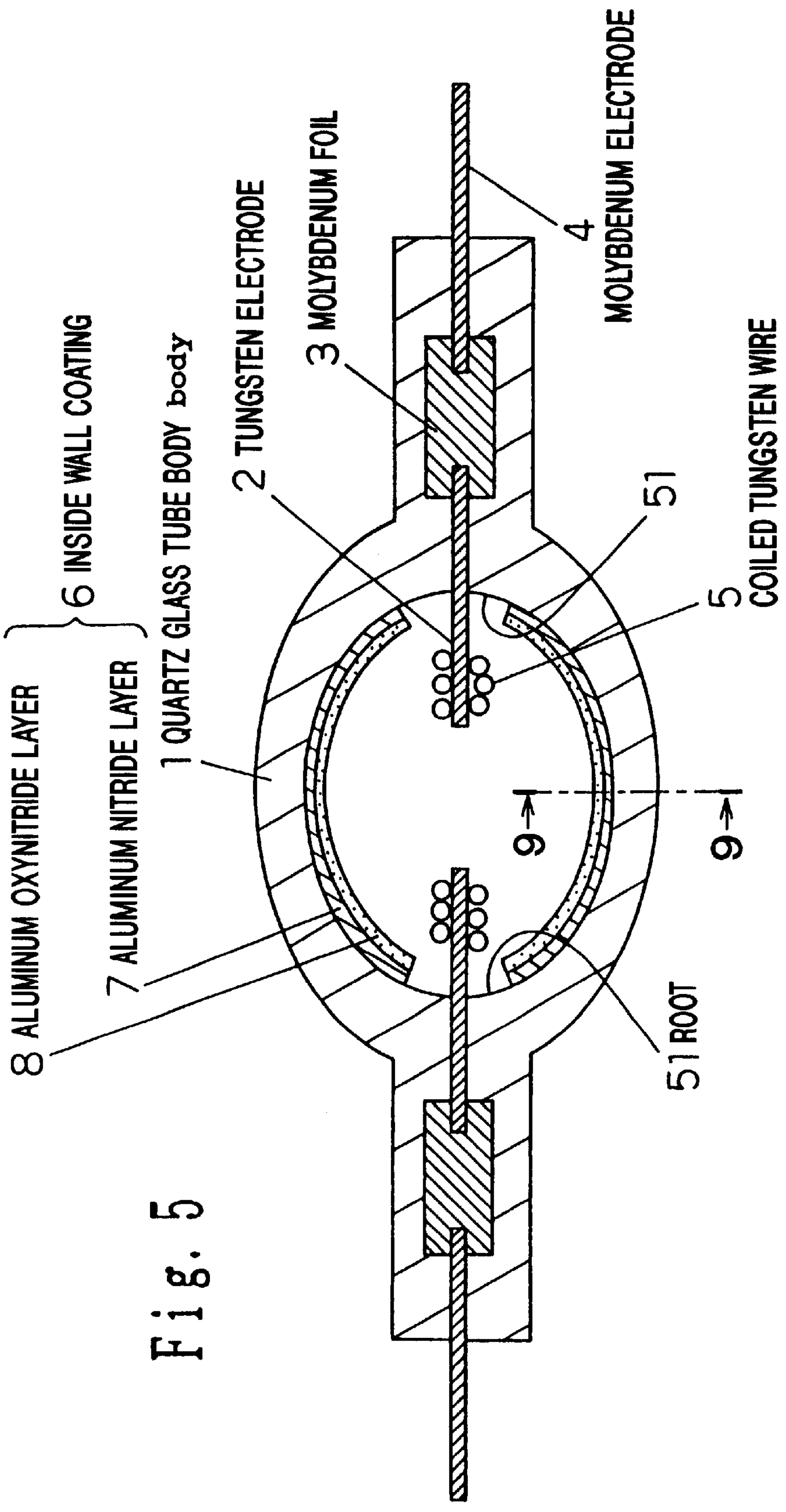
FIG. 5 is a sectional schema of a high-pressure discharge lamp, so constructed that quartz glass is exposed in the root 51 of a tungsten electrode 2, according to another embodiment of the present invention.

In a case of a structure shown in FIG. 5, devitrification phenomenon, caused by a reaction between the enclosed substances in a quartz glass tube body 1 and the quartz glass, selectively proceeds on the intentionally made portion without a protective coating as mentioned above, whereas devitrification slows down in the protective coating region.

Since the root of each tungsten electrode 2 exerts little effect on practical use even if devitrified, such a manufacturing method according to the present invention is effective in preventing the devitrification of the main portion through which the most part of a lamp packet passes, thereby resulting in a longer useful life of the lamp.

Figure 6:
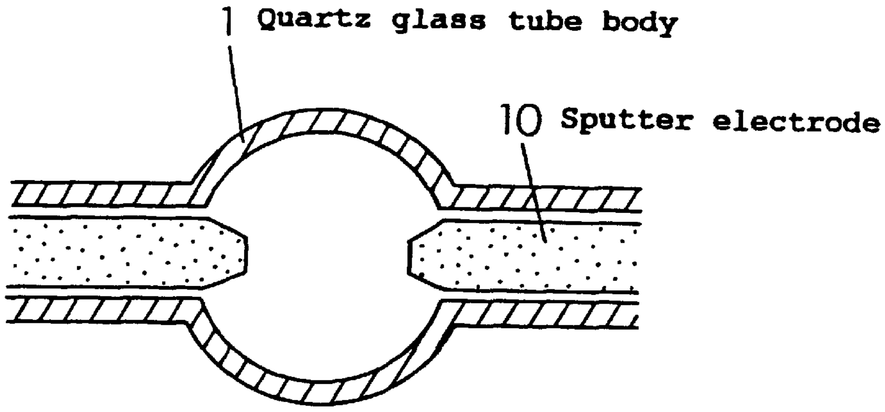
FIG. 6 is a schema showing a sputter electrode 10 and the shape of its tip in a sputtering device used in a method for manufacturing a discharge tube body for high-pressure discharge lamps according to one embodiment of the present invention.

Furthermore, the uniformity of the coating thickness is important for an optical thin coating. In contrast to a plane surface of the tip of each sputter electrode 10 as shown in FIG. 3, a nonplanar shape can enhances the uniformity of thickness in the inside wall coating. FIG. 6 shows a case of putting the tip of a target into a convex shape as one nonplanar shape.

Again, by optimizing sputter conditions, such as tip shape of a pair of sputter electrodes 10, distance between the tips and flow rate of a gas, the uniformity in the thickness of a layer or the distribution of coating thickness can be kept within ±10%.

Incidentally, the tip of each sputter electrode should be protruded toward the center of a discharge tube body formed in a spherical or spheroidal shape and the absence of protruding length leads to a worsened distribution of coating thickness.

Figure 7:
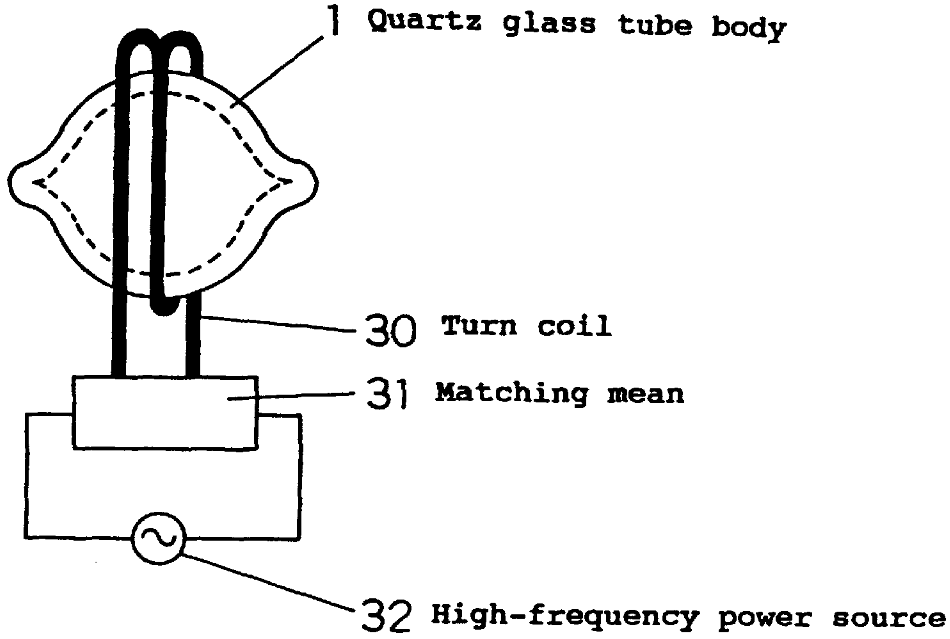
FIG. 7 is a schematic block diagram of an electrodeless discharge lamp.

In the above embodiment, what is called an electroded type of HID lamp having tungsten electrodes 2 has been described, but the present invention is not limited to this type but, for example, as shown in FIG. 7, applicable also to an electrodeless type of high-pressure discharge lamp arranged to give forth light by external excitation of a microwave or high frequency wave. Also in this case, a similar effect is obtained. In FIG. 7, Numerals 32, 30 and 31 denote a high-frequency power source externally provided for excitation emission of light in a high-pressure discharge lamp, matching means and a turn coil disposed to surrounding the outer periphery of a quartz glass tube body 1, respectively.

Next, yet another embodiment incorporating a trilayer coating, comprising a first layer of transparent dielectric having a linear expansion coefficient ranging from 0.8 to 2 ppm/° C., a second layer of transparent dielectric having a linear expansion coefficient ranging from 2 to 5 ppm/° C. and a third layer of transparent dielectric having a linear expansion coefficient ranging from 5 to 10 ppm/° C., on the inner wall face of a quartz glass hollow body will be described (see FIG. 8).

As shown in FIG. 3, insert a pair of tantalum metal (99.99% pure) sputter electrodes 10 into a quartz glass discharge tube body and evacuate down to a high vacuum of $5\times10^{-4}$ Pa.

Then, pass 2.4 sccm Ar gas and 1 sccm oxygen gas, and apply a 15 W high-frequency wave.

Then, replace the tantalum metal sputter electrodes with aluminum (99.999% pure) sputter electrodes and evacuate down to a high vacuum of $5\times10^{-4}$ Pa.

Then, pass 2.4 sccm Ar gas and 1 sccm oxygen gas, and apply a 15 W high-frequency wave.

Then, with the sputter electrodes kept as they are, pass 2.4 sccm Ar gas, 0.3 sccm oxygen gas and 0.7 sccm nitrogen gas, and apply a 15 W high-frequency wave.

Figure 8:
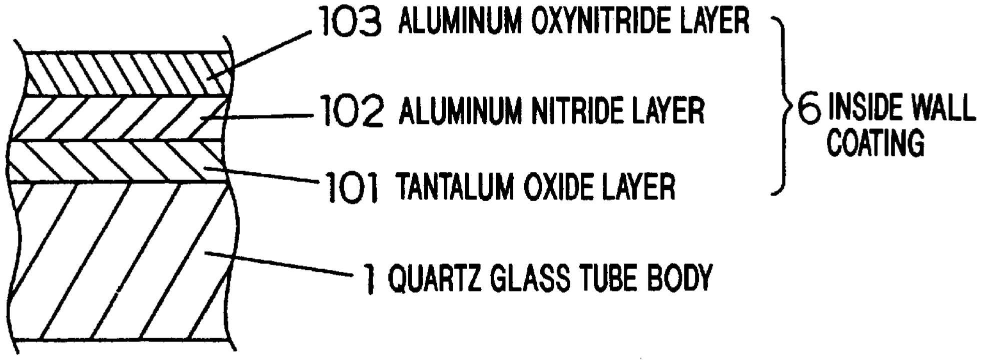
FIG. 8 is a sectional schema of a quartz glass tube body and a coating formed on the inside wall thereof for showing the constitution of a trilayer coating according to another embodiment of the present invention, which corresponds to an partly enlarged sectional schema taken along the line A–B of FIG. 1.

The sputter discharge time was set in such a manner that a 500 Å thick tantalum oxide layer 101, a 500 Å thick aluminum nitride layer 102 and a 1000 Å thick aluminum oxynitride layer 103 were formed (see FIG. 8).

Then, install a tungsten electrode 2 to a discharge tube body 1 at an interelectrode distance of 5.5 mm, seal in mercury, dysprosium iodide, neodymium iodide, cesium iodide and Ar gas, and thus complete a high-pressure discharge lamp.

According to this embodiment, it could be confirmed that the useful life of a high-pressure discharge lamp lengthens by 30–100% in comparison with that of a conventional discharge lamp without the inside wall coating.

In addition, due to a high thermal conductivity characteristic of the aluminum nitride coating, the temperature distribution of a quartz glass tube body became uniform and consequently the arc bending during horizontal lamp lighting decreased.

Substances to be sealed into a high-pressure discharge lamp may include various rare earth iodides or other metal iodides aside from the above.

Also, the present invention is found applicable to a high-pressure sodium discharge lamp.

In the meantime, causes of effectiveness in the present invention can be considered to lie in: that a stable structure was achieved in a wide temperature range by selecting and stacking various materials in such a manner that a heat expansion coefficient of each constituent layer increases with advance from a lower layer to a higher layer; that a highly corrosion-resistant aluminum oxynitride layer was employed as the top layer; and that the discharge tube body was uniformized by employing an aluminum nitride layer having a high thermal conductivity (150 W/mK) as an intermediate layer.

Thus, other various compositions are thinkable in a trilayer coating than that of the above embodiment.

That is, as with the above, a longer useful life of the high-pressure discharge lamp can be attained also by incorporating a trilayer coating, comprising a first layer of transparent dielectric having a linear expansion coefficient ranging from 0.8 to 2 ppm/° C. formed directly on the inner wall face of a quartz glass tube body, a second layer of transparent dielectric having a linear expansion coefficient ranging from 2 to 5 ppm/° C. formed on the first layer and a third layer of transparent dielectric having a linear expansion coefficient ranging from 5 to 10 ppm/° C. formed on the second layer as shown in TABLE 1. Incidentally, the left column of TABLE 1 shows the material of each layer described in the above embodiment, the middle column shows the allowable range of the linear expansion coefficient observed in materials of each layer and the right column shows materials usable in place of a material mentioned in the left column.

TABLE 1

| Material used in the embodiment | Allowable range of linear expansion coefficient (ppm/° C.) | Substitutive materials for a material mentioned in the left column |
|---|---|---|
| First layer | 0.8–2 | $Nb_2O_5$ |
| | | $V_2O_5$ |
| | | $Al_2O_3 + TiO_2$ |
| | | $HfO_2 + TiO_2$ |
| $Ta_2O_5$ | | $Ta_2O_5 + WOx$ |
| | | Cordierite |
| | | β-Spodumene |
| | | TaON |
| | | NbON |
| | | VON |
| Second layer | 2–5 | $Si_3N_4$ |
| | | $SnO_2$ |
| | | *c*-BN |
| | | ZnO |
| | | $Al_2O_3 + Nb_2O_5$ |
| AlN | | SiAlON |
| | | Murite |
| | | CrON |
| | | TiON |
| | | ZrON |
| | | HfON |
| | | SiON |
| Third layer | 5–10 | $Al_2O_3$ |
| | | $Y_2O_3$ |
| | | $MgAl_2O_4$ |
| AlON | | $ZnAl_2O_4$ |
| | | $YAlO_3$ |
| | | YON |
| | | MgON |
| | | ScON |

Incidentally, in TABLE 1, for example, $HfO_2+TiO_2$ means a compound oxide of Hf and Ti, while Cordierite denotes $2MgO+2Al_2O_3+SiO_2$, β-Spodumene denotes $Li_2O+Al_2O_3+4SiO_2$, SiAlON denotes Si—Al—O—N and Murite denotes $3Al_2O_3+2SiO_2$.

In a single crystal showing an asymmetrical crystal structure, a value of linear expansion coefficient is different depending on the direction of a crystal axis but here, an averaged value of linear expansion coefficient is considered in practical use.

For example, in aluminum nitride (AlN), a value of linear expansion coefficient is 4.15 ppm/° C. in the a-axis direction and 5.27 ppm/° C. in the c-axis direction, but may be regarded within the range from 4.5 to 4.8 ppm/° C. on average for polycrystals. Accordingly, in TABLE 1, AlN is classified in a material having a linear expansion coefficient ranging from 2 to 5.

Various oxynitrides formed by using such elements as aluminum, tantalum, niobium, vanadium, chromium, titanium, zirconium, hafnium, yttrium, scandium, magnesium, silicon and lanthanum rare earth elements exhibit different values of linear expansion coefficient depending to the kind of materials and the composition ratio of oxygen and nitrogen and accordingly can be used in layers corresponding to their respective values.

In cases of SiON, for example, the case of composition near that of $SiO_2$ exhibits a linear expansion coefficient (0.8–2 ppm/° C.) corresponding to the first layer, whereas the case of composition near that of $Si_3N_4$ exhibits a linear expansion coefficient (2–5 ppm/° C.) corresponding to the second layer. Thus, SiON classified as a material usable for the second layer in TABLE 1 has a composition near that of $Si_3N_4$.

For example, if spinel $MgAl_2O_4$ is employed in place of aluminum nitride in TABLE 1, a higher corrosion resistance can be obtained in a case of using alkali metal (such as Na and Li) as an sealed substance.

Figure 9:
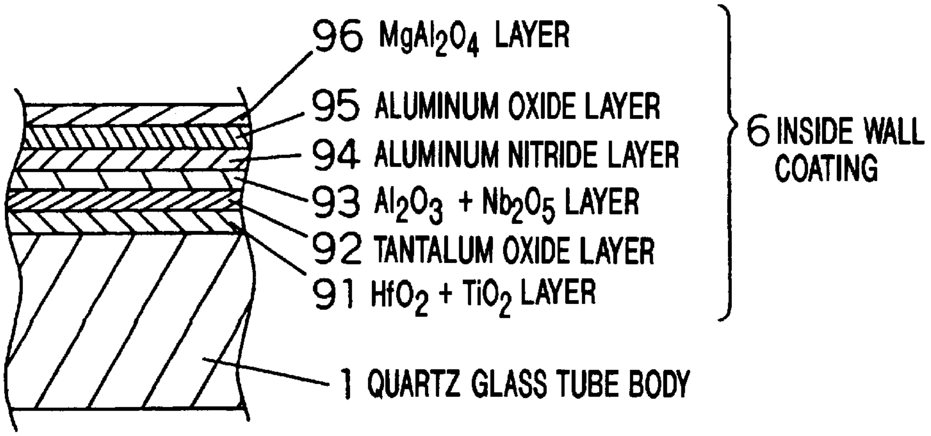
FIG. 9 is a sectional schema of a quartz glass tube body and a coating formed on the inside wall thereof for showing the constitution of a hexalayer coating according to another embodiment of the present invention, which corresponds to an partly enlarged sectional schema taken along the line A–B of FIG. 1.

Though a trilayer construction was considered in the above embodiment, actually, a further multi-layer construction is possible. FIG. 9 shows an example of coating comprising six layers.

As shown in FIG. 9, by stacking a first layer 91 of $HfO_2+TiO_2$ having a smaller linear expansion coefficient than that of tantalum oxide, a second layer 92 of tantalum oxide, a third layer 93 of $Al_2O_3+Nb_2O_5$ having a smaller linear expansion coefficient than that of aluminum nitride, a fourth layer 94 of aluminum nitride, a fifth layer 95 of aluminum oxide and a sixth layer, or the top layer, 96 of $MgAl_2O_4$, a hexalayer coating was formed. Increasing the number of layers in this way provided a lamp of higher durability.

However, an increase in the number of manufacturing processes may cause a higher cost in the above construction and therefore it is reasonable to determine the number of layers in accordance with a desired performance level.

Incidentally, in the above embodiment, a coating was made in a reactive sputter process by using metal sputter electrodes, but it is clear that a similar advantage can be obtained also in a sputter process using sputter electrodes containing oxide or nitride.

Furthermore, the sputter process is preferred as a coat making method, but a similar advantage is expectable even from making a coat in other processes, such as the thermo-CVD process, the plasma CVD process, the vacuum deposition process, the ion plating process.

In the above embodiment, a method for manufacturing a hollow tube body according to the present invention was described by taking a method for manufacturing a high-pressure discharge lamp and a discharge tube body for high-pressure discharge lamps as examples, but is not to limited to these and is also applicable to a method for manufacturing a hollow tube body for fluorescent lamps, for example. To sum up, only if a coating can be made wholly or partly on the inside wall of a hollow tube body in the sputtering process, the shape, size, type, usage or the like of a hollow tube body is indifferent.

As one example of forming a multi-layer coating comprising nitride layers and oxynitride layers according to the present invention, a case of there being an oxynitride layer as the top layer was described in the above embodiment (see FIGS. 2 and 4(C)), but a multi-layer coating is not limited to this and a reverse construction of there being a nitride layer as the top layer will do. In this case, a discharge tube body for high-pressure discharge lamps comprising a coating formed on the inside wall of a quartz glass hollow tube body may just as well be manufactured in accordance with the following process: Form an oxide layer of one or more elements on the inside wall of said hollow tube body, then applying a nitriding treatment to the formed oxide layer to change the whole or part of the relevant oxide layer into an oxynitride layer. As further another example, for example, the following process is also considered concretely: Form a layer of a predetermined metal on the inside wall of said hollow tube body, then applying oxynitriding treatment to the formed metal layer to change the whole or part of the relevant metal layer into an oxynitride layer.

Figure 10:
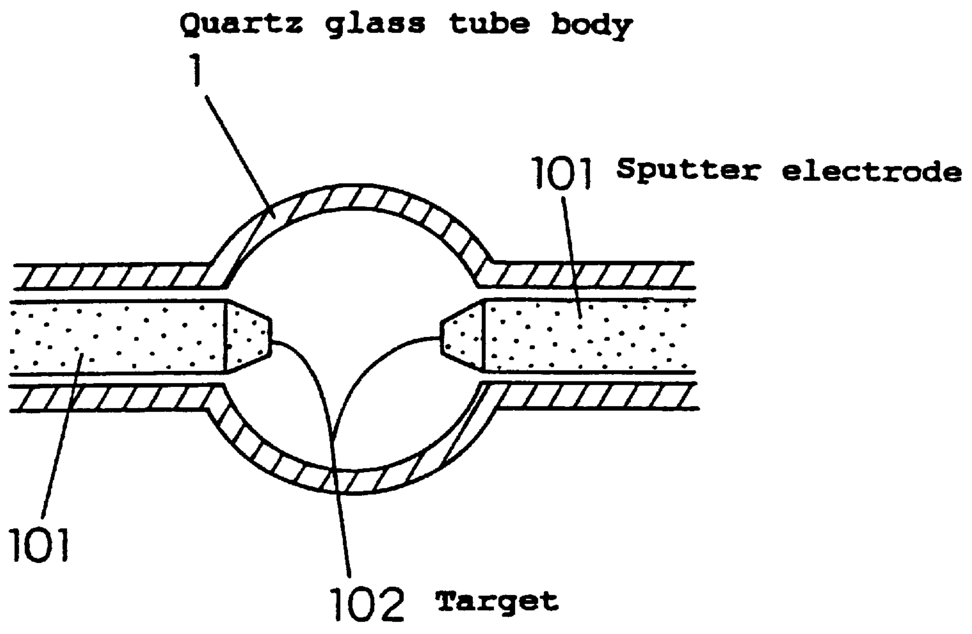
FIG. 10 is a schema showing the shape of a sputter electrode 101 and the target section 102 provided on its tip in a sputtering device used in a method for manufacturing a discharge tube body for high-pressure discharge lamps according to another embodiment of the present invention.

In the above embodiment, a case of a pair of sputter electrodes 10 made of a material containing the same element as that of a coating to be formed on the inside wall of a quartz glass tube body 1 was described but the composition of sputter electrodes is not limited to this and the construction of using a pair of sputter electrodes 101 having a target 102 provided at the tip that contains the same element as that of the coating to be formed on the inside wall of a hollow tube body is also possible as shown in FIG. 10. In this case, a material of sputter electrodes 101 does not need to contain the same element mentioned above.

As these, because of preventing the devitrification of a quartz glass tube body during lighting, the present invention can achieve a high-pressure discharge lamp of long useful life.

Also, because of using no ceramic discharge tube body, the present invention has many advantages that a linear transmissivity of light is high, a good optical characteristic near to that of a point light source is obtained, a tridimensional molding of a tube body is easy and the cost can be saved.

By taking advantage of an aluminum nitride coating of high thermal conductivity, the present invention has a further advantage in uniformizing the temperature distribution of a discharge tube body and reducing the heat convection, thereby decreasing the arc bending.

What is claimed is:

1. A method for manufacturing a hollow tube body comprising the steps of:

inserting, from an opening provided at each of both ends of a predetermined hollow tube body, a pair of sputter electrodes containing the same element as that of a coating to be formed on the inside wall of the hollow tube body;

fixing said pair of sputter electrodes in such a manner that the distance between the tips of said pair of mutually opposed sputter electrodes is kept apart by a predetermined distance; and forming said coating on the whole or a part of the inside wall of said hollow tube body in the sputtering process by applying DC voltage or high-frequency voltage between the said fixed sputter electrodes and generating a glow discharge.

2. A method for manufacturing a hollow tube body comprising the steps of:

inserting, from an opening provided at each of both ends of a predetermined hollow tube body, a pair of sputter electrodes provided at their tips with targets containing the same element as that of a coating to be formed on the inside wall of the hollow tube body;

fixing said pair of sputter electrodes in such a manner that the distance between the tips of said pair of mutually opposed sputter electrodes is kept apart by a predetermined distance; and forming said coating on the whole or a part of the inside wall of said hollow tube body in the sputtering process by applying DC voltage or high-frequency voltage between the said fixed sputter electrodes and generating a glow discharge.

3. A method for manufacturing a hollow tube body according to claim 1, wherein:

said part of the inside wall of said hollow tube body means the whole or a part of portions of the inside wall other than those near to said openings.

4. A method for manufacturing a hollow tube body according to claim 2, wherein:

said part of the inside wall of said hollow tube body means the whole or a part of portions of the inside wall other than those near to said openings.

5. A method for manufacturing a hollow tube body according to claim 1, wherein:

the tips of said sputter electrodes are put into a nonplanar shape.

6. A method for manufacturing a hollow tube body according to claim 2, wherein:

the tips of said targets are put into a nonplanar shape.

* * * * *